(12) United States Patent
Kinter

(10) Patent No.: US 7,627,794 B2
(45) Date of Patent: Dec. 1, 2009

(54) APPARATUS AND METHOD FOR DISCRETE TEST ACCESS CONTROL OF MULTIPLE CORES

(75) Inventor: Ryan C. Kinter, Sammamish, WA (US)

(73) Assignee: MIPS Technologies, Inc., Sunnyvale, CA (US)

( * ) Notice: Subject to any disclaimer, the term of this patent is extended or adjusted under 35 U.S.C. 154(b) by 394 days.

(21) Appl. No.: 11/442,695

(22) Filed: May 25, 2006

(65) Prior Publication Data

US 2007/0288814 A1 Dec. 13, 2007

(51) Int. Cl.
*G01R 31/28* (2006.01)
(52) U.S. Cl. .................................. 714/724
(58) Field of Classification Search ............. 714/724
See application file for complete search history.

(56) References Cited

U.S. PATENT DOCUMENTS

| | | | | |
|---|---|---|---|---|
| 6,378,093 | B1 * | 4/2002 | Whetsel | 714/726 |
| 6,686,759 | B1 * | 2/2004 | Swamy | 324/765 |
| 6,918,057 | B1 * | 7/2005 | Brophy et al. | 714/30 |
| 2004/0006729 | A1 * | 1/2004 | Pendurkar | 714/733 |

* cited by examiner

*Primary Examiner*—James C Kerveros
(74) *Attorney, Agent, or Firm*—Cooley Godward Kronish LLP

(57) ABSTRACT

An electronic circuit includes multiple computational cores. A test access protocol machine with a core address register and a signal routing control circuit addresses a selected computational core as specified by the core address register and routes output test data from the selected computational core.

5 Claims, 2 Drawing Sheets

APPARATUS AND METHOD FOR DISCRETE TEST ACCESS CONTROL OF MULTIPLE CORES

BRIEF DESCRIPTION OF THE INVENTION

This invention relates generally to digital circuits. More particularly, this invention relates to test access techniques for discretely accessing multiple computational cores.

BACKGROUND OF THE INVENTION

A semiconductor intellectual property (IP) core, IP block, or core refers to a reusable unit of logic, cell, or chip layout design that is owned by an entity. The core may be licensed to another party or can be owned and used by a single party. In digital logic applications, cores are typically offered as generic gate netlists. The netlist is a Boolean representation of the core's logical function. Some vendors offer synthesizable versions of their cores. Synthesizable cores are delivered in a hardware description language, such as Verilog or VHDL, permitting customer modification at the functional level.

Cores are implemented with physical circuits. Testing of physical circuits is typically performed in accordance with a Test Access Protocol (TAP). JTAG, an acronym for Joint Test Action Group, is the name used for the IEEE 1149.1 standard entitled Standard Test Access Port and Boundary-Scan Architecture. While designed for printed circuit boards, JTAG is commonly used for testing sub-blocks of integrated circuits and is also used for debugging embedded systems. When used as a debugging tool, an in-circuit emulator, which in turn uses JTAG as the transport mechanism, enables a programmer to access an on-chip debug module which is integrated into the core. The debug module enables the programmer to debug the software of an embedded system.

JTAG supports the serial scan of test data between multiple cores within a single system. In order to communicate with a single core, the TAP controller serially scans through all of the TAP chains. Non-addressed cores can be placed in a bypass mode to minimize the total length of the TAP chain. However, placing non-addressed cores into bypass mode incurs an overhead cost.

In view of the foregoing, it would be desirable to provide an improved technique for accessing and testing individual cores in a multiple core system.

SUMMARY OF THE INVENTION

The invention includes an electronic circuit with multiple computational cores. A test access protocol machine with a core address register and a signal routing control circuit addresses a selected computational core as specified by the core address register and routes output test data from the selected computational core.

A computer readable medium includes executable instructions to describe multiple computational cores. Executable instructions also specify a test access protocol machine with a core address register and a signal routing control circuit to address a selected computational core as specified by the core address register. Output test data is routed from the selected computational core in accordance with signal routing control signals from the signal routing control circuit.

The invention also includes a method of loading a core address specifying a single core of a multiple core system. Signal routing control signals are enabled. Output test data from the single core specified by the core address is routed in accordance with the signal routing control signals.

The invention also includes a test access protocol machine with a core address register and a signal routing control circuit to address a selected computational core of a set of computational cores. The selected computational core is specified by the core address register. Test data from the selected computational core is routed in accordance with signal routing control signals from the signal routing control circuit.

The invention also includes a method of forming a test access protocol machine to access a single core of a multiple core system. The test access protocol machine is operated in a first state wherein output test data from the single core is directly delivered to the test access protocol state machine and in a second state wherein output test data from the single core is initially routed through at least one additional core of the multiple core system prior to being delivered to the test access protocol state machine.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
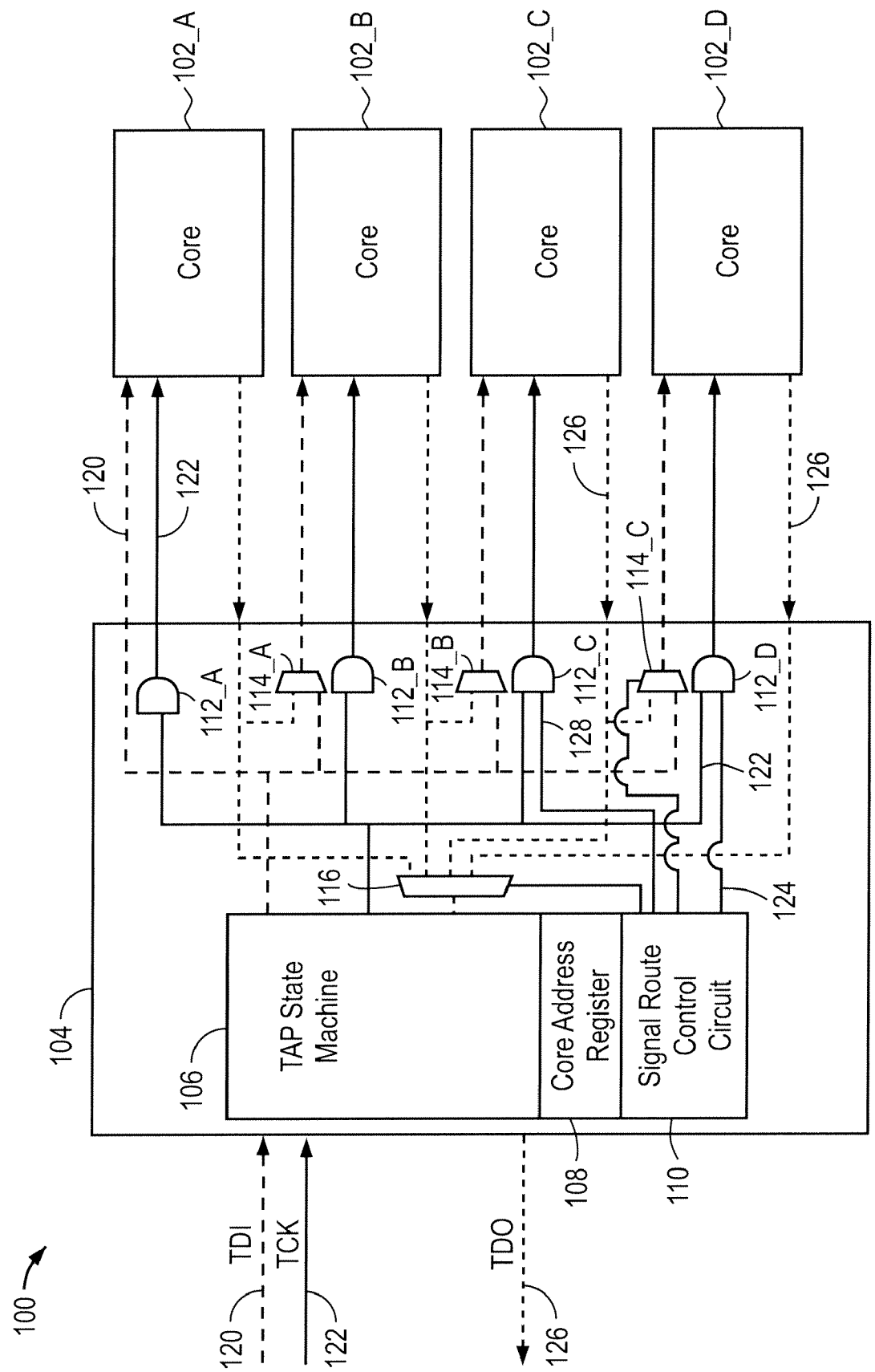
FIG. 1 illustrates a system configured in accordance with an embodiment of the invention.

FIG. 1 illustrates a system 100 configured in accordance with an embodiment of the invention. The system 100 includes a set of IP cores, computational cores, or cores 102_A through 102_D. The system 100 also includes a test access controller 104. The test access controller 104 includes a standard TAP state machine 106, which is configured to perform operations in accordance with the JTAG standard. In addition to implementing standard JTAG operations, the TAP state machine 106 is configured to include a core address register 108 and a signal routing control circuit 110 to implement operations of the invention. Alternately, the core address register 108 and the signal routing control circuit 110 may interface with the TAP state machine 106. Reference herein to a TAP machine or TAP state machine contemplates either embodiment.

The core address register stores the address of an individual core. Thus, the invention allows, for example, core 102_A to be addressed without accessing cores 102_B, 102_C and 102_D. The core address register may be loaded from a probe (not shown). In particular, a probe applies a core address to a node associated with the TAP state machine 106. Alternately, the core address register is loaded from a memory map within an individual core 102.

The test access controller 104 includes additional circuitry to implement operations of the invention. In particular, a set of logical AND gates 112_A, 112_B, 112_C and 112_D are used to control test clock access to individual cores. When the test clock is enabled, an individual core drives output data. Otherwise, no output data is produced by a non-addressed core. Multiplexers 114_A, 114_B, 114_C and 114_D facilitate daisy chain routing of output data, as discussed below. Multiplexer 116 operates to select test data from an individually addressed core, as discussed below. The logical AND gates 112, the multiplexers 114 and the multiplexer 116 are controlled by the signal routing control circuit 110.

The signal routing control circuit 110 generates signal routing control signals to coordinate the routing of test data from a selected core. In one embodiment of the invention, the test data is routed directly from the selected core (e.g., 102_A) through the TAP state machine 106 without traversing additional cores (e.g., 102_B, 102_C or 102_D). Alternately, the test data is routed from the selected core (e.g., 102_B) through an arbitrary set of cores (e.g., 102_C or 102_C and 102_D). This arbitrary daisy chaining still requires that cores be adjacent in the embodiment of FIG. 1. However, this limitation may be avoided by using additional multiplexers.

As shown in the figure, a Test Data In (TDI) signal is applied to the test access controller 104. The TAP state machine 106 routes the TDI signal to each core, as shown with long dashed lines 120. The test access controller 104 also receives a test clock signal TCK, which is also routed to each of the cores, via the TAP state machine 106, via solid lines 122. More particularly, the clock signal is initially routed to the logical AND gate 112 associated with a core.

Consider an example wherein the core address register stores an address that specifies core 102_D. In this example, the signal routing control circuit 110 generates a digital high signal on line 124. The logical AND gate 112_D receives the TCK signal on line 122 and the digital high signal on line 124. Thus, the core 102_D receives the TCK signal and generates test data on short dashed line 126. The test data is applied to the multiplexer 116. The signal routing control circuit applies a control signal to the multiplexer 116 such that the multiplexer selects and passes the test data to the TAP state machine 106. In this example, the signal routing control circuit 110 only enables core 102_D to generate test data. Accordingly, a single core of the multiple core system has been accessed to produce test data without serial scanning through additional cores.

The invention is also operative to access a single core and then serially route test data through one or more additional cores. Consider a case in which core 102_C is to be accessed. In this case, the signal routing control circuit 110 generates a digital high signal to logical AND gate 112_C via line 128. This allows the clock TCK to drive test data from core 102_C over line 126.

A control signal from the signal routing control circuit 110 may then be used to select the output data of line 126 at multiplexer 114_C. Thus, the test data is driven through core 102_D. If the test data is not to be driven through core 102_D, it may be directly routed to the TAP state machine via a select signal from that signal routing control circuit 110, which is applied to multiplexer 116. Using control signals from the signal routing control circuit 110 therefore allows arbitrary routing of test data through one or more daisy chained cores.

Figure 2:
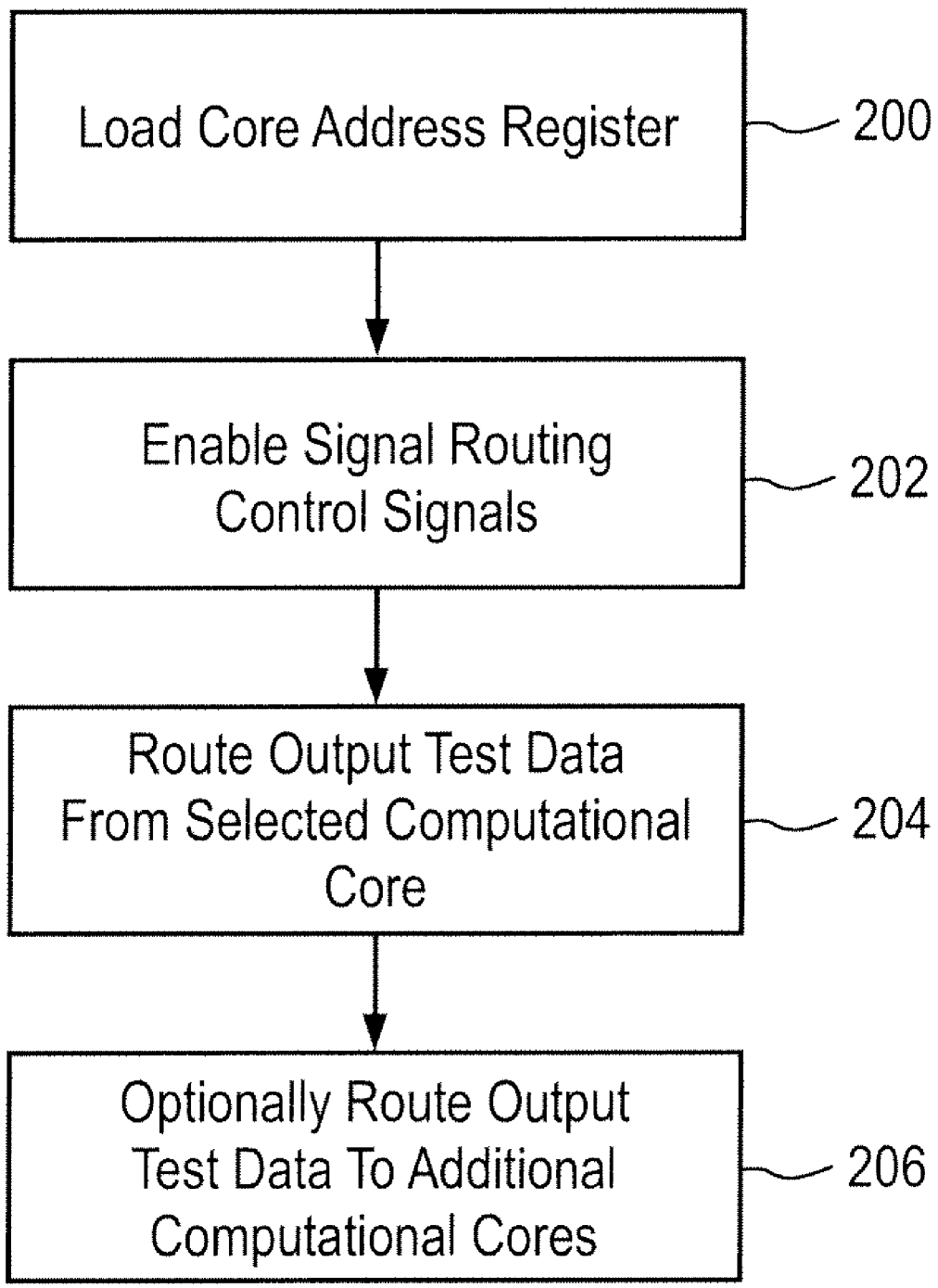
FIG. 2 illustrates processing operations associated with an embodiment of the invention.

FIG. 2 illustrates processing operations associated with an embodiment of the invention. Initially, a core address register is loaded 200. As previously indicated, the loading operation may be implemented from a probe or a memory map within a core 102.

Signal routing control signals are then enabled 202. As previously indicated, the signal routing control signals include signals for application to one or more logical AND gates 112_A, 112_B, 112_C and 112_D, multiplexer select signals for multiplexers 112_A, 112_B, 112_C and 112_D, and multiplexer select signals for multiplexer 116.

The next processing operation of FIG. 2 is to route test data from a selected computation core 204. Various examples of this operation are discussed above. Optionally, the test data may be routed to additional computational cores 206. As discussed above, arbitrary daisy chaining to additional adjacent cores may be implemented in accordance with an embodiment of the invention.

Thus, the invention provides a JTAG addressable block in a multiple core system to control the connection of the TAP chain between a JTAG probe and each of the cores. This allows for more efficient communication with individual cores.

The invention allows for individually addressable cores without using additional pins. The invention facilitates traditional daisy chained connections or single core access.

While various embodiments of the invention have been described above, it should be understood that they have been presented by way of example, and not limitation. It will be apparent to persons skilled in the relevant computer arts that various changes in form and detail can be made therein without departing from the scope of the invention. For example, in addition to using hardware (e.g., within or coupled to a Central Processing Unit ("CPU"), microprocessor, microcontroller, digital signal processor, processor core, System on chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modeling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analog-based medium). Embodiments of the present invention may include methods of providing the apparatus described herein by providing software describing the apparatus and subsequently transmitting the software as a computer data signal over a communication network including the Internet and intranets.

It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. An electronic circuit, comprising:
a test access protocol machine with a core address register to receive and store a core address and a signal routing control circuit to address a selected computational core, of a set of computational cores, as specified by the core address stored in the core address register and to route output test data from the selected computational core, wherein the signal routing control circuit applies control signals to a set of multiplexers and logical gates to address selected computational cores and wherein signal routing control signals control an output multiplexer to route the output test data from the selected computational core.

2. The electronic circuit of claim 1 wherein the signal routing control circuit generates an enable signal to facilitate application of a test clock signal to the selected computational core.

3. A method, comprising:
   forming a test access protocol machine to selectively access a single core of a multiple core system as specified by a core address stored in a core address register; and
   operating the test access protocol machine in a first state wherein output test data from the single core is directly delivered to the test access protocol state machine and in a second state wherein output test data from the single core is daisy chain routed through at least one additional core of the multiple core system prior to being delivered to the test access protocol state machine.

4. The method of claim 3 wherein operating includes generating a first multiplexer control signal to establish the first state and producing a second set of multiplexer control signals to establish the second state.

5. The method of claim 3 further comprising loading an address for the single core into the test access protocol state machine.

* * * * *